United States Patent
Tomita et al.

(10) Patent No.: US 7,838,425 B2
(45) Date of Patent: Nov. 23, 2010

(54) METHOD OF TREATING SURFACE OF SEMICONDUCTOR SUBSTRATE

(75) Inventors: Hiroshi Tomita, Yokohama (JP); Hiroyasu Iimori, Yokohama (JP); Hisashi Okuchi, Yokohama (JP); Tatsuhiko Koide, Yokohama (JP); Linan Ji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 12/257,493

(22) Filed: Oct. 24, 2008

(65) Prior Publication Data

US 2009/0311874 A1    Dec. 17, 2009

(30) Foreign Application Priority Data

Jun. 16, 2008  (JP) .............................. 2008-156708
Oct. 6, 2008   (JP) .............................. 2008-259636

(51) Int. Cl.
*H01L 21/306* (2006.01)

(52) U.S. Cl. .......................... 438/690; 438/906; 134/2; 134/902; 257/E21.228

(58) Field of Classification Search ............... 134/2, 134/902; 257/E21.228; 438/690, 906
See application file for complete search history.

(56) References Cited

U.S. PATENT DOCUMENTS

| | | | |
|---|---|---|---|
| 6,620,260 B2 * | 9/2003 | Kumagai et al. ............. 134/26 |
| 6,858,089 B2 * | 2/2005 | Castrucci ..................... 134/2 |
| 7,163,018 B2 * | 1/2007 | Verhaverbeke et al. ...... 134/1.3 |
| 7,659,201 B2 * | 2/2010 | Ohashi et al. ................ 438/672 |
| 2002/0189643 A1 * | 12/2002 | Chen et al. .................... 134/6 |
| 2006/0278254 A1 * | 12/2006 | Jackson ....................... 134/21 |
| 2007/0102021 A1 * | 5/2007 | Nappa et al. .................. 134/2 |
| 2008/0002162 A1 * | 1/2008 | Jansen et al. ................. 355/30 |
| 2008/0020498 A1 * | 1/2008 | Okamoto et al. ............. 438/14 |
| 2008/0207005 A1 * | 8/2008 | Farkas ......................... 438/745 |
| 2009/0255558 A1 * | 10/2009 | Inukai et al. ................. 134/30 |

FOREIGN PATENT DOCUMENTS

| JP | 2004-140321 | 5/2004 |
|---|---|---|
| JP | 2005-203563 | 7/2005 |
| JP | 2008-16780 | 1/2008 |

OTHER PUBLICATIONS

Notification of Reasons for Rejection issued by the Japanese Patent Office on Jul. 10, 2009, for Japanese Patent Application No. 2009-140992, and English-language translation thereof.

* cited by examiner

*Primary Examiner*—George Fourson
(74) *Attorney, Agent, or Firm*—Finnegan, Henderson, Farabow, Garrett & Dunner, L.L.P.

(57) ABSTRACT

A method of treating the surface of a semiconductor substrate has cleaning the semiconductor substrate having a pattern formed thereon by using a chemical solution, removing the chemical solution by using pure water, forming a water repellent protective film on the surface of the semiconductor substrate, rinsing the semiconductor substrate by using pure water, and drying the semiconductor substrate.

9 Claims, 7 Drawing Sheets

FIG.4

MOISTURE INTRUDED

NO MOISTURE INTRUDED

METHOD OF TREATING SURFACE OF SEMICONDUCTOR SUBSTRATE

CROSS REFERENCE TO RELATED APPLICATIONS

This application is based upon and claims benefit of priority from the Japanese Patent Application No. 2008-156708, filed on Jun. 16, 2008, and the Japanese Patent Application No. 2008-259636, filed on Oct. 6, 2008, the entire contents of which are incorporated herein by reference.

BACKGROUND OF THE INVENTION

1. Field of the Invention

The present invention relates to a method of treating the surface of a semiconductor substrate.

2. Related Art

In the process of manufacturing a semiconductor device, there is performed a treatment for supplying a treatment solution (chemical solution or pure water) to the surface of a semiconductor wafer as a substrate to be treated. In particular, in a cleaning treatment of a semiconductor wafer, a chemical solution for the cleaning treatment is supplied to the surface of the wafer, and thereafter a rinse treatment is performed by supplying pure water to the surface of the wafer. After the rinse treatment, there is performed a drying treatment for removing the pure water left on the wafer surface and for drying the wafer. As a method for performing the drying treatment, there is, for example, a method of drying the wafer in such a manner that IPA (Isopropyl alcohol) is used to substitute the pure water on the wafer with IPA.

However, there is a problem that a pattern formed on the wafer is collapsed by the surface tension of the solution during the drying treatment. In order to solve the problem, there are proposed a method of using a solution with low surface tension, such as HFE (hydrofluoroether) instead of IPA, and a method of using a supercritical process.

However, according to miniaturization of pattern dimensions in recent years, it has become difficult to prevent the pattern collapse even by using HFE. Further, even in the supercritical process, it is known that the pattern collapse is caused when moisture, or the like, is brought into a chamber in which a supercritical atmosphere is realized.

SUMMARY OF THE INVENTION

According to one aspect of the present invention, there is provided a method of treating the surface of a semiconductor substrate comprising:

cleaning the semiconductor substrate having a pattern formed thereon by using a chemical solution;

removing the chemical solution by using pure water;

forming a water repellent protective film on the surface of the semiconductor substrate;

rinsing the semiconductor substrate by using pure water; and drying the semiconductor substrate.

BRIEF DESCRIPTION OF THE DRAWINGS

FIG. 4 is a figure showing pattern states after drying treatments performed in the cases where the water repellent protective film was formed, and where it was not formed;

DETAILED DESCRIPTION OF THE INVENTION

First Embodiment

Figure 1:
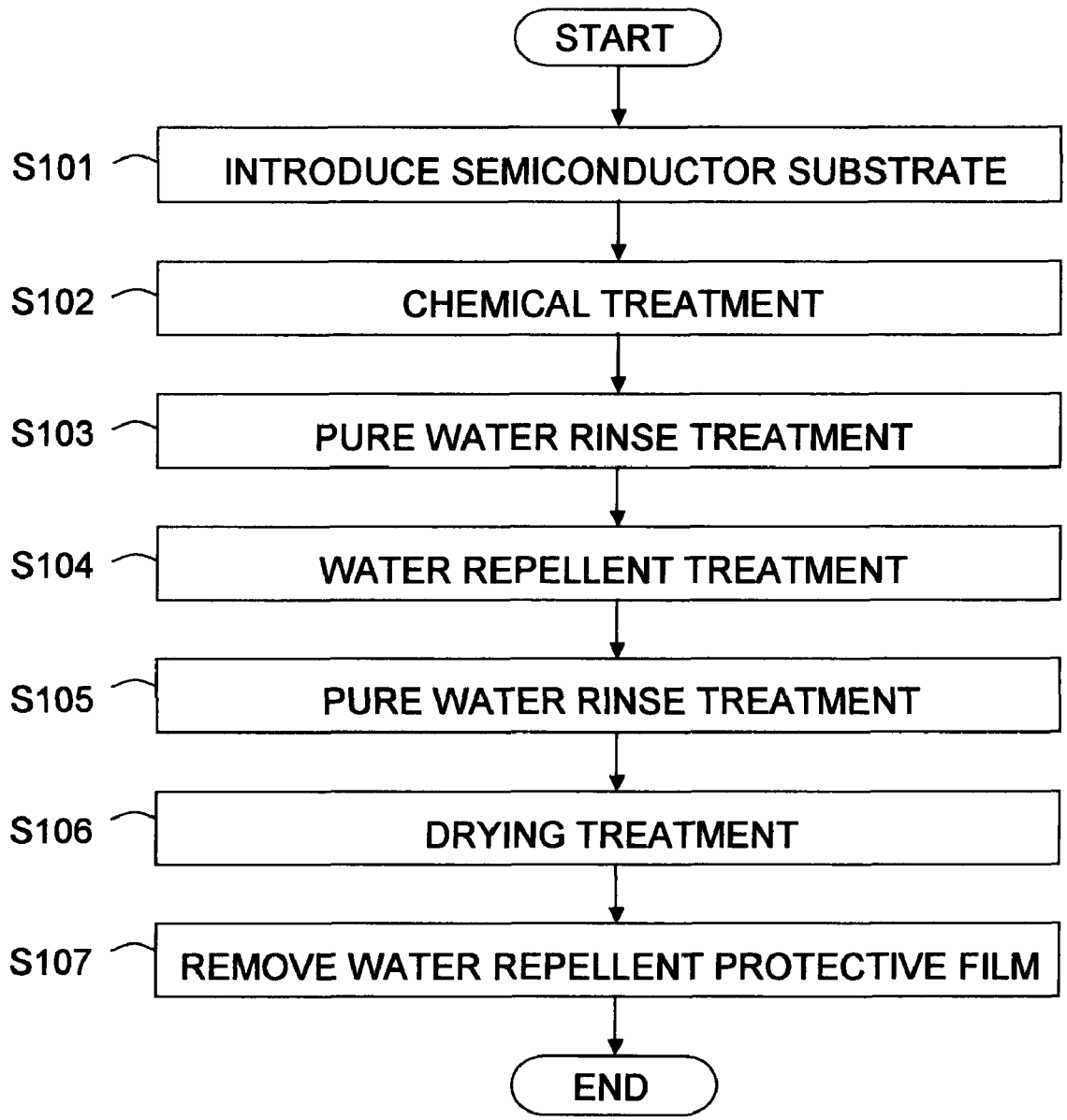
FIG. 1 is a flow chart for explaining a surface treatment method according to a first embodiment of the present invention.
Figure 2:
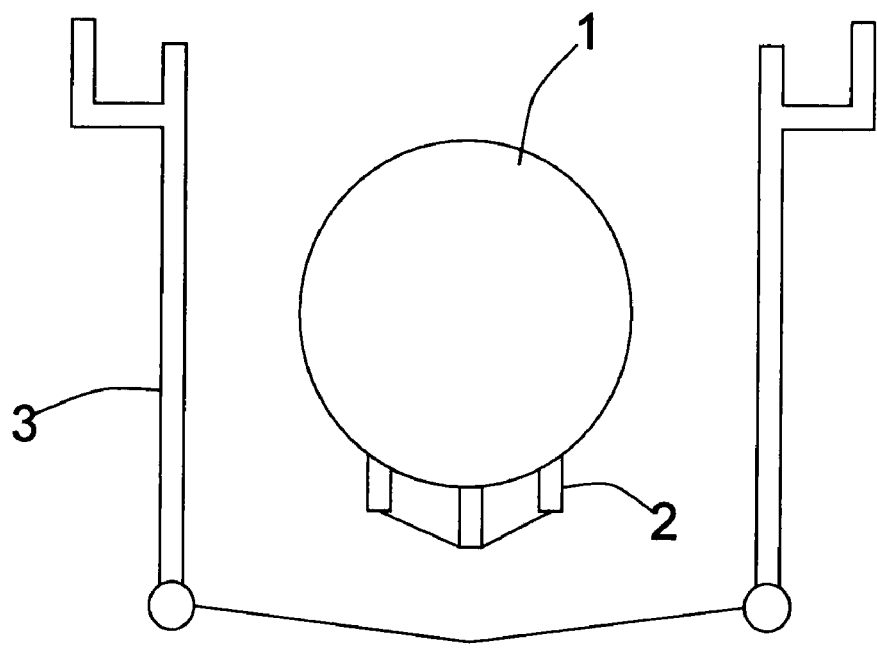
FIG. 2 is a figure showing a schematic configuration of a surface treatment apparatus according to the first embodiment.

A method of treating the surface of a semiconductor substrate, according to a first embodiment of the present invention, will be described with reference to a flow chart shown in FIG. 1 and a sectional view of a main part of a surface treatment apparatus shown FIG. 2. The surface treatment apparatus shown in FIG. 2 is a batch type apparatus configured to collectively perform cleaning and drying of a plurality of semiconductor substrates.

(Step S101) A patterned semiconductor substrate (wafer) 1 is held by a substrate holding section 2, and is introduced into a treatment tank 3.

(Step S102) The semiconductor substrate 1 is cleaned by supplying a chemical solution from a treatment chemical solution supplying section (not shown) to the treatment tank 3. As the chemical solution, there is used a mixed solution (SPM) of sulfuric acid and aqueous hydrogen peroxide.

(Step S103) The semiconductor substrate 1 is rinsed by supplying pure water from the treatment chemical solution supplying section to the treatment tank 3, so that components of the chemical solution used in step S102 are removed.

(Step S104) A surfactant (water soluble surfactant) is supplied to the treatment tank 3 from the treatment chemical solution supplying section, so that a low-wettability protective film (water repellent protective film) is formed on the surface of the semiconductor substrate 1. The surfactant is a substance having both a hydrophobic group and a hydrophilic group in the molecule.

(Step S105) Pure water is supplied to the treatment tank 3 from the treatment chemical solution supplying section, so as to rinse out the remaining surfactant.

(Step S106) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water in which the semiconductor substrate 1 is immersed is gradually lowered by draining the pure water.

Further, the drying treatment may also be performed by using a solution with low surface tension, such as HFE.

Further, the semiconductor substrate 1 may also be dried in such a manner that the semiconductor substrate 1 is introduced into a chamber in which a supercritical state can be realized, in the state where the surface of the semiconductor substrate 1 is covered with a solution such as IPA, that the solution, such as IPA, covering the semiconductor substrate 1 is substituted with a supercritical fluid, and that the supercritical fluid is gasified by suitably changing the pressure and temperature in the chamber. As the supercritical fluid, it is possible to use $CO_2$, $N_2$, $H_2$, Ar, HFE, and the like.

Since a pattern formed on the semiconductor substrate 1 is covered with the water repellent protection film, the contact angle θ of solution is made to become large (close to 90°).

Figure 3:
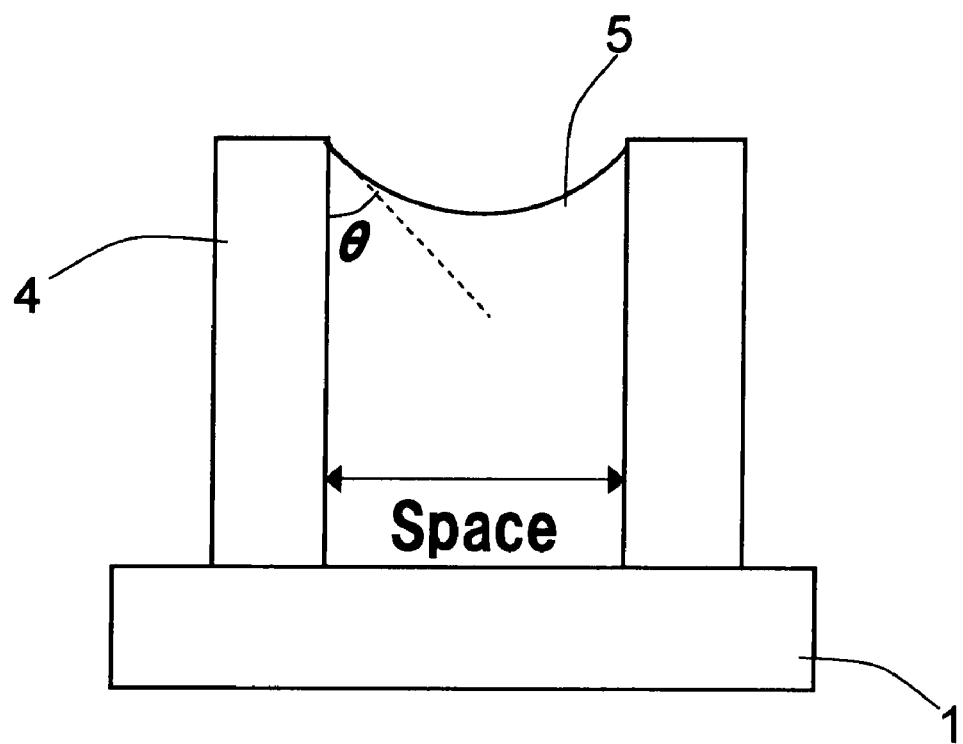
FIG. 3 is a figure for explaining surface tension of a solution, which is applied to a pattern.

FIG. 3 shows a state where a part of patterns 4 formed on the semiconductor substrate 1 is wetted with a solution 5. Here, when a distance between the patterns 4 is defined as Space, and when the surface tension of the solution 5 is defined as γ, the power which contributes to the pattern collapse P applied to the pattern 4 is expressed by the following formula.

$$P=2\times\gamma\times\cos\theta/Space \quad\text{(Formula 1)}$$

It can be seen from the formula that when θ approaches 90°, cos θ approaches zero and hence the power P of the solution, which is applied to the pattern during the drying treatment, is reduced. Thereby, it is possible to prevent the pattern from being collapsed during the drying treatment.

(Step S107) An ashing treatment, such as dry ashing and ozone gas treatments, is performed, so as to remove the water repellent protective film formed on the surface of the semiconductor substrate 1.

Figure 4:
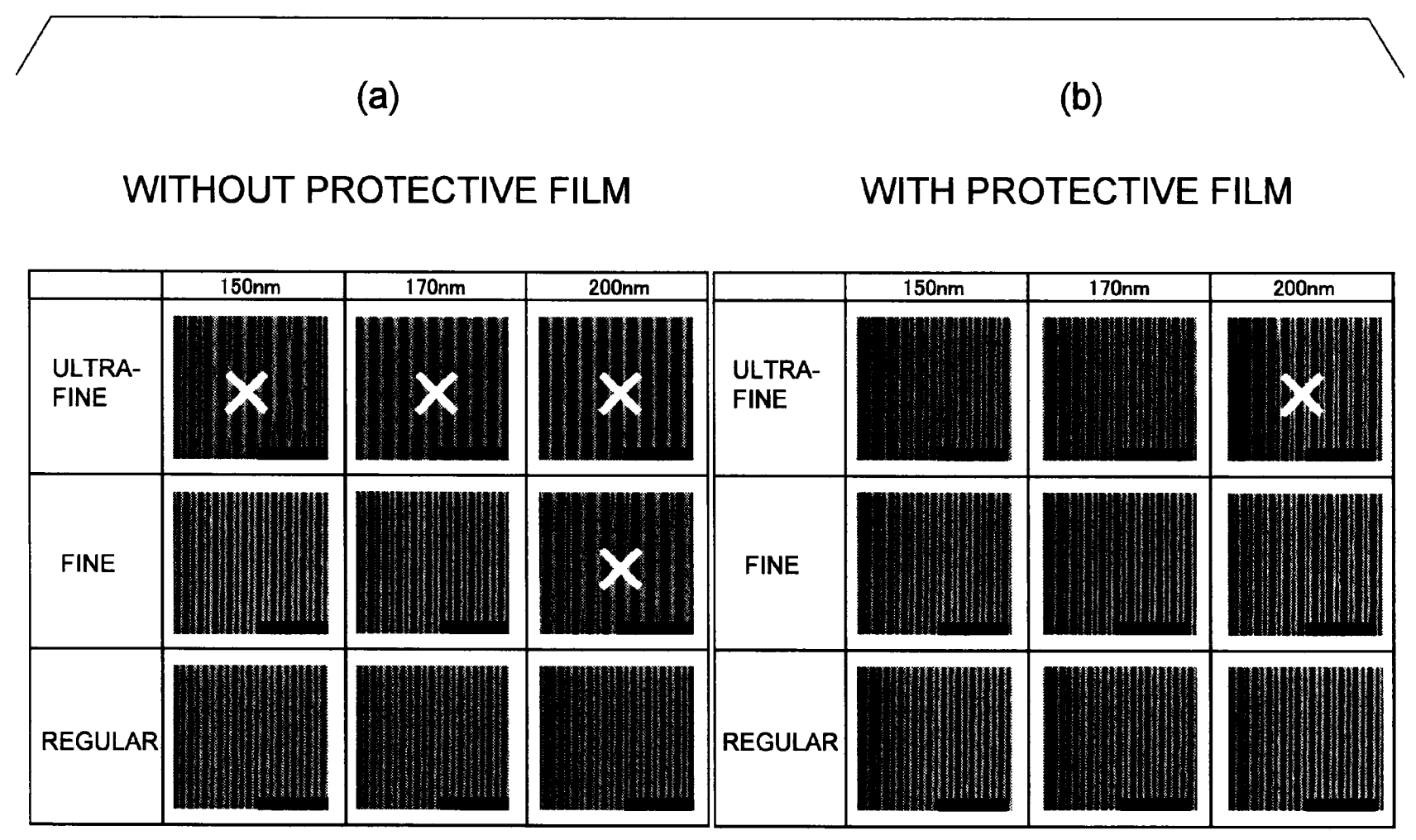

FIG. 4 shows pattern states after the drying treatments performed in the cases where the water repellent protective film was formed, and where it was not formed. The surface treatment was performed for patterns having three heights of 150 nm, 170 nm and 200 nm, and having three line widths of regular, fine and ultra-fine line widths (regular>fine>ultra-fine).

As can be seen from FIG. 4(a), in the case where the protective film was not formed, the pattern collapse was caused in the ultra-fine line width pattern having any of the heights of 150 nm, 170 nm and 200 nm. Further, the pattern collapse was also caused in the fine line width pattern having the height of 200 nm.

On the other hand, as can be seen from FIG. 4(b), in the case where the water repellent protective film was formed, the pattern collapse was able to be prevented in the ultra-fine line width patterns other than the ultra-fine line width pattern having the height of 200 nm. It is seen that by the formation of the water repellent protection film, the pattern collapse due to cleaning and drying can be prevented even in a pattern with a high aspect ratio and thereby the collapse margin can be improved.

In this way, in the case where the surface of the semiconductor substrate 1 is cleaned, it is possible to prevent the collapse of the fine pattern during the drying treatment by the formation of the water repellent protective film on the substrate surface.

When an ideal supercritical drying technique is used in the drying treatment process (step S106) of the semiconductor substrate 1, the surface tension of supercritical fluid is zero, and hence the pattern collapse can be prevented even when the water repellent treatment is not performed. However, when moisture is brought into the supercritical chamber, the moisture left in the pattern is not substituted by the supercritical fluid, and thereby the pattern is collapsed.

Figure 5:
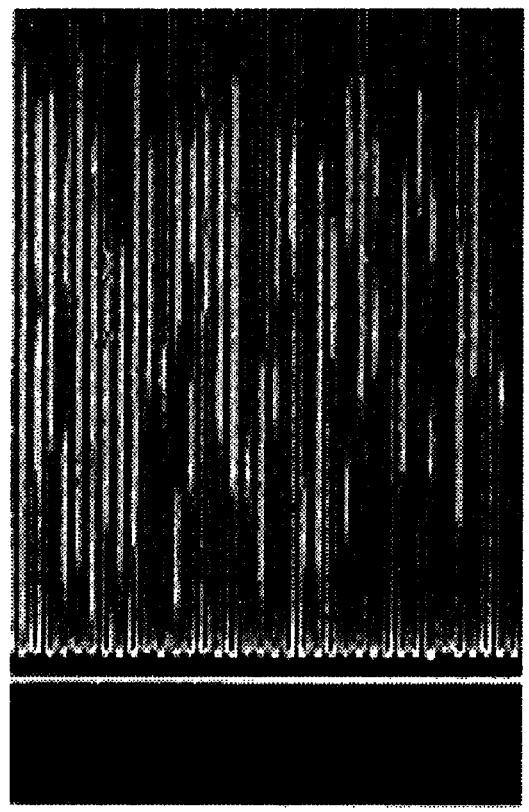
FIG. 5 is a figure showing pattern states after the respective supercritical drying treatments performed in the cases where moisture was brought into a supercritical chamber, and where moisture was not brought into the supercritical chamber.
Figure 5:
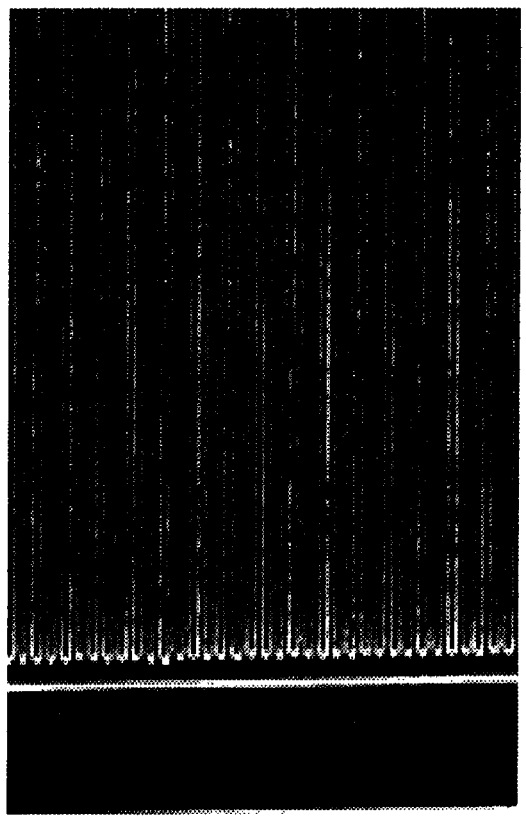

FIG. 5 shows pattern states after the respective supercritical drying treatments performed in the cases where moisture was brought into the supercritical chamber and where moisture was not brought into the supercritical chamber. It is seen from the figure that when moisture is brought into the supercritical chamber, the pattern collapse is caused.

However, when the water repellent treatment is performed to form the water repellent protection film on the substrate surface similarly to the above described first embodiment, the pattern collapse can be prevented even in the case where a trace of moisture is brought into the supercritical chamber.

Second Embodiment

Figure 6:
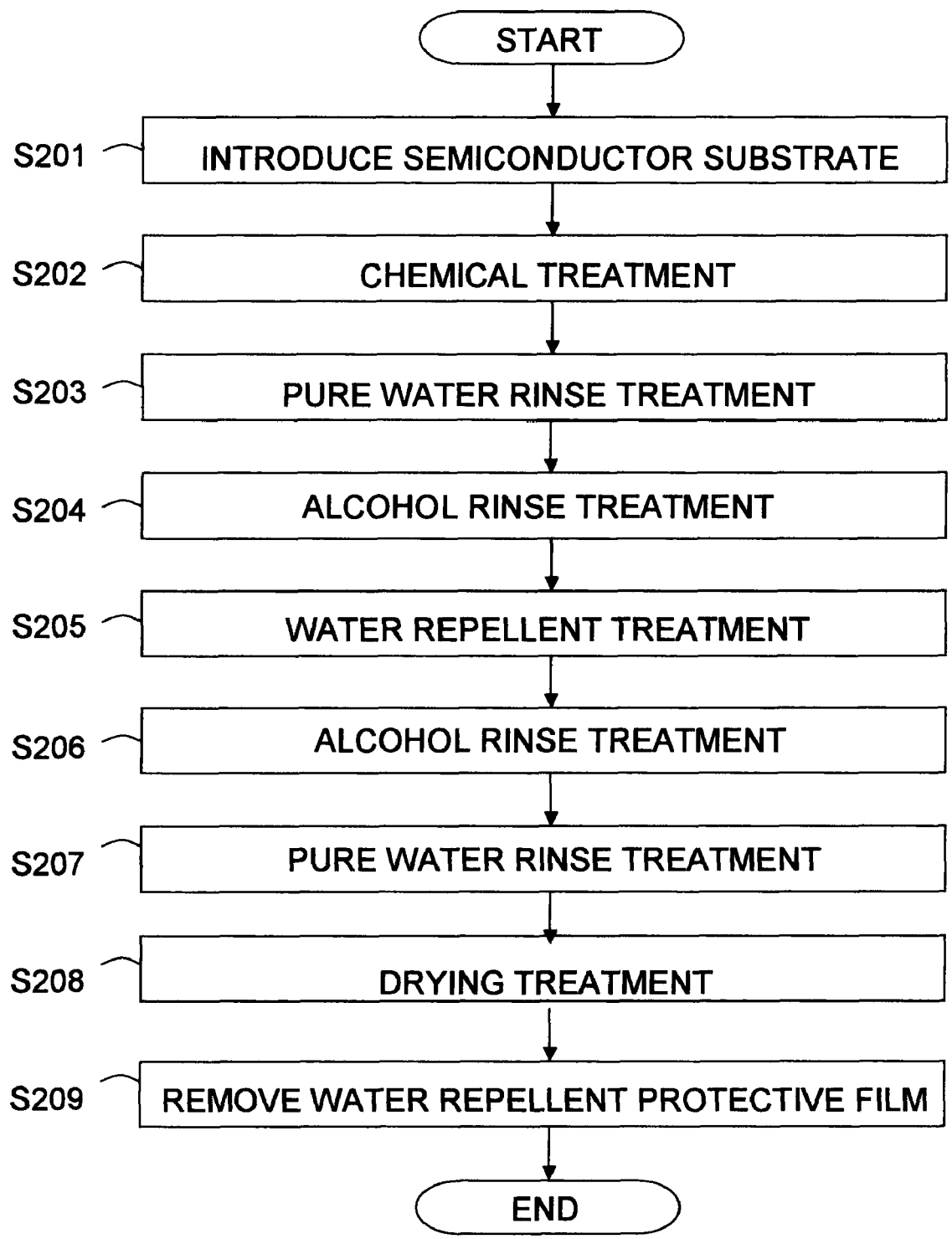
FIG. 6 is a flow chart for explaining a surface treatment method according to a second embodiment of the present invention.
Figure 7:
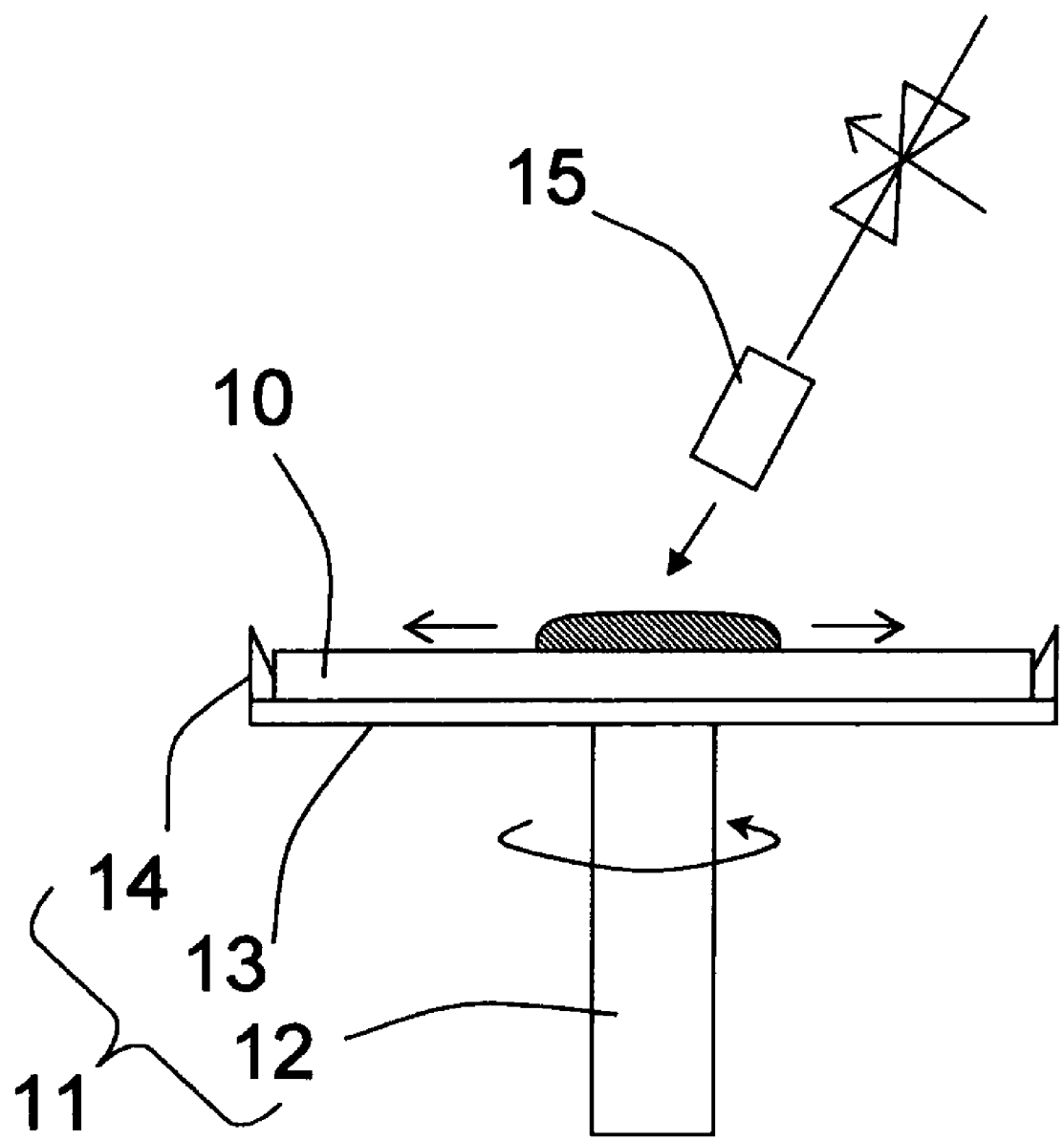
FIG. 7 is a figure showing a schematic configuration of a surface treatment apparatus according to the second embodiment.

A method of treating the surface of a semiconductor substrate, according to a second embodiment of the present invention, will be described with reference to a flow chart shown in FIG. 6, and a cross sectional view of the main part of a surface treatment apparatus shown in FIG. 7. The surface treatment apparatus shown in FIG. 7 is a single wafer type which performs treatment of one semiconductor substrate at a time by supplying a treatment solution to the semiconductor substrate.

(Step S201) A patterned semiconductor substrate (wafer) 10 to be treated is carried in by a carrying section (not shown), and is delivered to a spin chuck 11. The spin chuck 11 is a substrate holding and rotating mechanism by which the semiconductor substrate 10 is substantially horizontally held and rotated.

The spin chuck 11 includes a rotating shaft 12 extended in substantially vertical direction, a disk-like spin base 13 attached to the upper end of the rotating shaft 12, and a chuck pin 14 which is provided at the periphery of the spin base 13 and is configured to hold the substrate.

(Step S202) The semiconductor substrate 10 is rotated at a predetermined rotation speed, and a chemical solution is supplied near the rotation center of the surface of the semiconductor substrate 10 from a nozzle 15 provided above the spin chuck 11. The chemical solution is, for example, an SPM.

The chemical solution is made to spread over the entire surface of the semiconductor substrate 10 by being subjected to the centrifugal force caused by the rotation of the semiconductor substrate 10, and thereby a chemical solution (cleaning) treatment of the semiconductor substrate 10 is performed.

(Step S203) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the chemical solution left on the surface of the semiconductor substrate 10 by the pure water.

(Step S204) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the pure water left on the surface of the semiconductor substrate 10.

(Step S205) A silane coupling agent is supplied near the rotation center of the surface of the semiconductor substrate 10 from the nozzle 15. The silane coupling agent includes, in the molecule, a hydrolyzable group having affinity and reactivity with an inorganic material, and an organic functional group capable of being chemically bonded to an organic material. For example, hexamethyldisilazane (HMDS), tetramethyl silyl dimethylamine (TMSDMA), tetramethyl silyl diethylamine (TMSDEA), and the like, can be used as the silane coupling agent.

The silane coupling agent is made to spread over the entire surface of the semiconductor substrate 10 by being subjected to the centrifugal force caused by the rotation of the semiconductor substrate 10. Thereby, a protective film (water repellent protective film) with low wettability is formed on the surface of the semiconductor substrate 10.

The water repellent protective film is formed by the occurrence of esterification reaction of the silane coupling agent. Therefore, the reaction may be promoted by increasing the temperature of the solution by performing an anneal treatment or by irradiating ultraviolet rays.

(Step S206) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the silane coupling agent left on the surface of the semiconductor substrate 10.

(Step S207) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the IPA left on the surface of the semiconductor substrate 10 with the pure water.

(Step S208) A drying treatment of the semiconductor substrate 10 is performed. For example, there is performed a spin dry treatment in which the semiconductor substrate 10 is dried in such a manner that the rotation speed of the semiconductor substrate 10 is increased to a predetermined spin dry rotation speed, so as to shake off the pure water left on the surface of the semiconductor substrate 10.

The semiconductor substrate 10 may also be dried in such a manner that the semiconductor substrate 10 is introduced into the chamber in which a supercritical state can be realized in the state where the surface of the semiconductor substrate 10 is covered by a fluid such as IPA, and that the fluid, such as IPA, covering the semiconductor substrate 10 is substituted by a supercritical fluid, and that the supercritical fluid is gasified by suitably changing the pressure and temperature inside the chamber. As the supercritical fluid, it is possible to use $CO_2$, $N_2$, $H_2$, Ar, HFE, and the like.

The pattern formed on the semiconductor substrate 10 is covered by the water repellent protective film, and hence the contact angle θ of the fluid is made to become large (close to 90°). Thereby, since cos θ approaches zero, the power which contributes to the pattern collapse, which is applied to the pattern during the drying treatment, is reduced, so that the pattern collapse can be prevented.

(Step S209) An ashing treatment, such as dry ashing and ozone gas treatments, is performed, so that the water repellent protective film formed on the surface of the semiconductor substrate 10 is removed.

Even when the surface treatment of the semiconductor substrate is performed according to the present embodiment, the same effect as that of the above described first embodiment (see FIG. 4) can be obtained.

In this way, in the case where the surface of the semiconductor substrate 10 is cleaned, the collapse of fine pattern during the drying treatment can be prevented by forming the water repellent protective film on the surface of the substrate.

In the present embodiment, the alcohol rinse treatment is performed (step S204, S206) before and after the forming process of the water repellent protective film (step S205). This is because some types of silane coupling agents used at the time of forming the water repellent protective film can't be substituted with pure water. Therefore, in the case where the silane coupling agent is a substance capable of being substituted with pure water, the alcohol rinse treatment can be eliminated.

Third Embodiment

Figure 8:
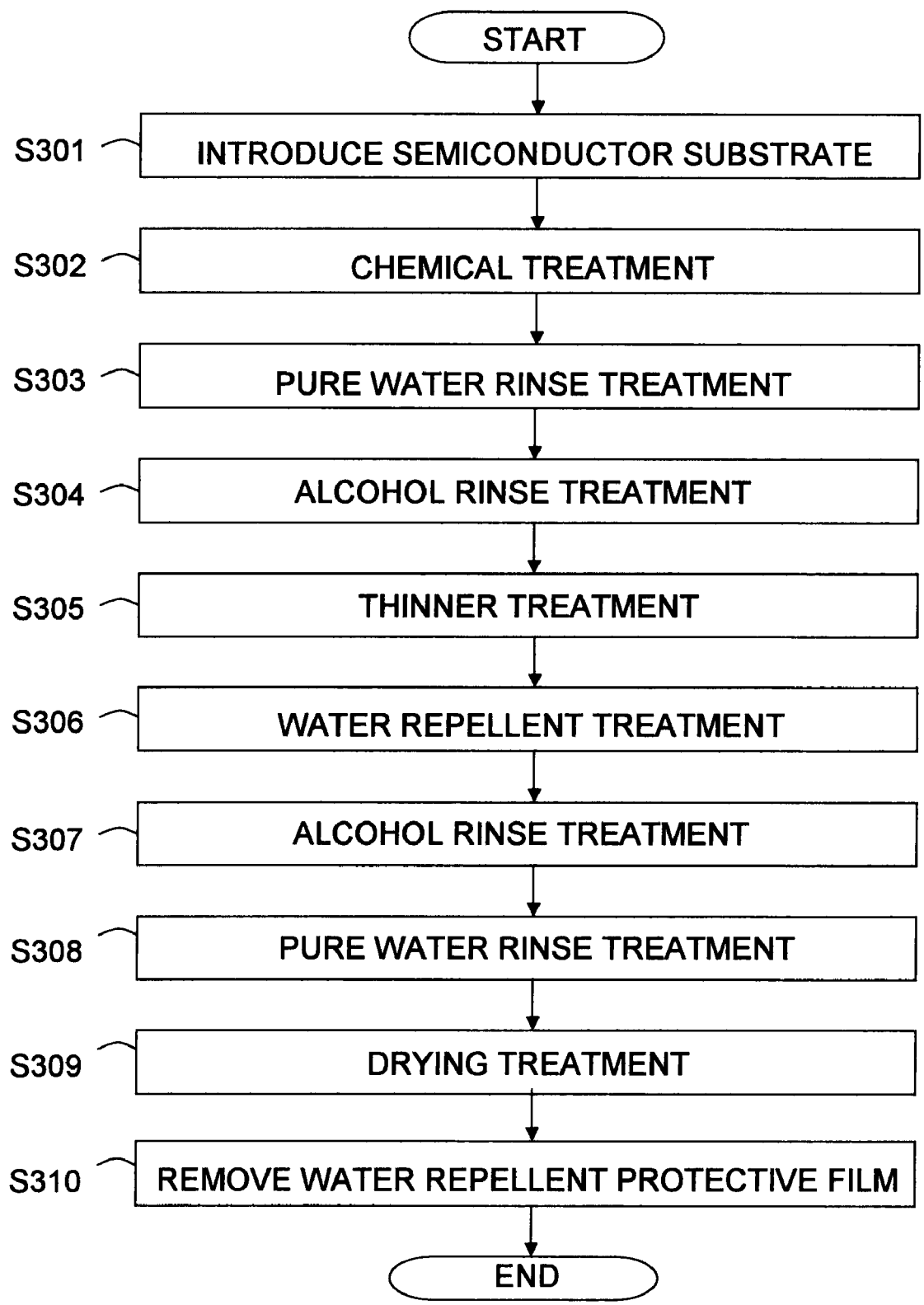
FIG. 8 is a flow chart for explaining a surface treatment method according to a third embodiment of the present invention.

A method of treating the surface of a semiconductor substrate, according to a third embodiment of the present invention, will be described with reference to a flow chart shown in FIG. 8. Further, it is assumed that there is used a batch type surface treatment apparatus which is the same as the surface treatment apparatus shown in FIG. 2 and which is configured to collectively clean and dry a plurality of semiconductor substrates, (Step S301) The semiconductor substrate 1 is held by the substrate holding section 2, and is introduced into the treatment tank 3.

(Step S302) A chemical solution is supplied to the treatment tank 3 from a treatment chemical solution supplying section (not shown), so that the semiconductor substrate 1 is cleaned. As the chemical solution, there is used a mixed solution (SPM) of sulfuric acid and aqueous hydrogen peroxide.

(Step S303) Pure water is supplied into the treatment tank 3 from the treatment chemical solution supplying section. Thereby, the semiconductor substrate 1 is rinsed, so that components of the chemical solution used in step S302 are removed.

(Step S304) IPA (isopropyl alcohol) is supplied to the treatment tank 3 from the treatment chemical solution supplying section, so that an alcohol rinse treatment for substituting the pure water with the IPA is performed.

(Step S305) A thinner is supplied to the treatment tank 3 from the treatment chemical solution supplying section, so that the IPA is substituted with the thinner. Propylene glycol monomethyl ether acetate (PGMEA) and a cyclohexanone can be used as the thinner.

(Step S306) A silane coupling agent is supplied to the treatment tank 3 from the treatment chemical solution supplying section, so that a low wettability protective film (water repellent protective film) is formed on the surface of the semiconductor substrate 1.

As the silane coupling agent, it is possible to use, for example, Hexamethyidisilazane (HMDS), tetramethyl silyl dimethylamine (TMSDMA), tetramethyl silyl diethylamine (TMSDEA), and the like. Further, the silane coupling agent may be diluted by using a thinner.

(Step S307) IPA is supplied to the treatment tank 3 from the treatment chemical solution supplying section, so that the silane coupling agent is substituted with the IPA.

(Step S308) Pure water is supplied to the treatment tank 3 from the treatment chemical solution supplying section, so that the IPA is substituted with the pure water.

(Step S309) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water, in which the semiconductor substrate 1 is immersed, is gradually lowered by draining the pure water. Further, the drying treatment may also be performed by using a solution with low surface tension, such as HFE.

Further, the semiconductor substrate 1 may also be dried in such a manner that the semiconductor substrate 1 is introduced into a chamber in which a supercritical state can be realized in the state where the surface of the semiconductor substrate 1 is covered with a solution such as IPA, that the solution, such as IPA, covering the semiconductor substrate 1 is substituted with the supercritical fluid, and that the supercritical fluid is gasified by suitably changing the pressure and temperature in the chamber. As the supercritical fluid, it is possible to use $CO_2$, $N_2$, $H_2$, Ar, HFE, and the like.

A pattern formed on the semiconductor substrate 10 is covered with the water repellent protective film, and hence the contact angle θ of the fluid is made to become large (close to 90°). Thereby, since cos θ approaches zero, the power which contributes to the pattern collapse, which is applied to the pattern during the drying treatment, is reduced, so that the pattern collapse can be prevented.

(Step S310) An ashing treatment, such as dry ashing and ozone gas treatments, is performed, so as to remove the water repellent protective film formed on the surface of the semiconductor substrate 1.

In this way, in the case where the surface of the semiconductor substrate 10 is cleaned, the collapse of fine pattern during the drying treatment can be prevented by forming the water repellent protective film on the surface of the substrate.

It is known that when IPA or $H_2O$, each of which has a hydroxyl group, is added to the silane coupling agent used in the water repellent treatment (step S306), the hydrolysis of the silane coupling agent is caused so that the water repellent performance of the silane coupling agent is deteriorated. The deterioration of the water repellent performance reduces the effect of preventing the pattern collapse.

Thus, in the present embodiment, after the pure water rinse (step S303) and the IPA substitution (step S304) are performed, the thinner treatment (step S305) is performed before the water repellent treatment (step S306) is performed, so that the IPA is substituted by the thinner containing no hydroxyl group.

As a result, the water repellent performance of the silane coupling agent is not deteriorated, and thereby the pattern collapse can be prevented. In the case where the thinner can be substituted with water, the IPA substitution (step S304) can be eliminated. Further, like the above described second embodiment, in the case where the silane coupling agent is a substance capable of being substituted with pure water, the alcohol rinse treatment (step S307) can be eliminated.

The above described first and third embodiments are used in the batch type surface treatment apparatus, but can also be used in the single wafer type surface treatment apparatus. Similarly, the above described second embodiment is used in the single wafer type surface treatment apparatus, but can also be used in the batch type surface treatment apparatus.

In the above described embodiments, the ashing treatment for removing the water repellent protective film is performed after the drying treatment of the semiconductor substrate. However, in the case where an RIE process is performed after the drying treatment, the ashing treatment need not be performed because the water repellent protective film is also removed in the RIE process.

Note that the formation of the water repellent protective film explained in the above described embodiments is to form a "protective film exhibiting water repellency" on a "substance exhibiting hydrophilicity", such as for example an oxide film and a nitride film, which forms the surface of a base fine pattern. When the base fine pattern is made of polysilicon, amorphous silicon, or the like, and when a hydrogen fluoride based chemical treatment is performed to the base fine pattern, the surface of the base fine pattern is made to become a hydrogen terminated water repellent state. In this case, the hydrogen fluoride based chemical treatment also corresponds to the water repellent protective film forming process. In order to further improve the water repellency, it is possible to use the surfactant or the silane coupling agent, which are explained in the above described embodiments.

In order to prevent a pattern formed on a substrate from being collapsed, it is necessary to reduce the force (P expressed by the above described formula 1) applied to the pattern. Among the parameters in the above described formula 1, Space is a fixed parameter determined by the pattern dimension, and the wettability cos θ is a fixed parameter determined by a relationship between the substance forming the fine pattern (surface) and the solution. In the conventional substrate treatment, attention is directed to the surface tension γ, and hence a fluid having a low value of the surface tension γ is used to reduce the force applied to the pattern. However, there is a limit in lowering the surface tension γ, so that it is not possible to prevent the pattern collapse.

On the other hand, as described above, in the surface treatment method according to the embodiments of the invention, the pattern collapse can be prevented in such a manner that a water repellent protective film is formed on the pattern surface, and that the force applied to the pattern during the drying treatment is made very small by controlling the wettability represented by a value of cos θ.

The surface treatment methods according to the above described embodiments are particularly effective for preventing the pattern collapse at the time of an aspect ratio of eight or more.

What is claimed is:

1. A method of treating the surface of a semiconductor substrate comprising:
    cleaning the semiconductor substrate having a pattern formed thereon by using a chemical solution;
    removing the chemical solution by using pure water;
    forming a water repellent protective film on the surface of the semiconductor substrate;
    rinsing the semiconductor substrate by using pure water;
    drying the semiconductor substrate; and
    after drying the semiconductor substrate, removing the water repellant protective film.

2. The method of treating the surface of a semiconductor substrate according to claim 1, wherein the water repellent protective film is formed by using a surfactant or a silane coupling agent.

3. The method of treating the surface of a semiconductor substrate according to claim 1, wherein the semiconductor substrate is rinsed by using alcohol before and/or after the water repellent protective film is formed.

4. The method of treating the surface of a semiconductor substrate according to claim 3, wherein after the semiconductor substrate is rinsed by using the alcohol, the alcohol is substituted with a thinner before the water repellent protective film is formed.

5. The method of treating the surface of a semiconductor substrate according to claim 4, wherein the water repellent protective film is formed by using a silane coupling agent.

6. The method of treating the surface of a semiconductor substrate according to claim 4, further comprising an ashing treatment to remove the water repellent protective film.

7. The method of treating the surface of a semiconductor substrate according to claim 1, wherein the semiconductor substrate is dried by using a spin drying method, an evaporation drying method, or a reduced pressure drying method.

8. The method of treating the surface of a semiconductor substrate according to claim 1, wherein the semiconductor substrate is dried in such a manner that a solvent containing isopropyl alcohol or hydrofluoroether is used to substitute the pure water left on the semiconductor substrate with the solvent, and that the solvent is then evaporated and dried.

9. The method of treating the surface of a semiconductor substrate according to claim 1, wherein the semiconductor substrate is dried in such a manner that a solvent containing isopropyl alcohol or hydrofluoroether is used to substitute the pure water left on the semiconductor substrate with the solvent, and that a supercritical fluid is substituted for the solvent and is then gasified.

* * * * *